United States Patent [19]
Chambers et al.

[11] Patent Number: 5,488,003
[45] Date of Patent: Jan. 30, 1996

[54] METHOD OF MAKING EMITTER TRENCH BICMOS USING INTEGRATED DUAL LAYER EMITTER MASK

[75] Inventors: Stephen Chambers; Brian J. Brown; Chan-Hong Chern, all of Portland; Robert Chau, Beaverton; Leopoldo D. Yau, Portland, all of Oreg.

[73] Assignee: Intel Corporation, Santa Clara, Calif.

[21] Appl. No.: 40,673

[22] Filed: Mar. 31, 1993

[51] Int. Cl.⁶ .................................................. H01L 21/265
[52] U.S. Cl. ................... 437/31; 437/203; 148/DIG. 10; 148/DIG. 11; 257/565; 257/587
[58] Field of Search ..................... 437/31, 203; 257/587, 257/565; 148/DIG. 10, DIG. 11

[56] References Cited

U.S. PATENT DOCUMENTS

| | | | |
|---|---|---|---|
| 4,435,898 | 3/1984 | Gaur et al. | 437/31 |
| 5,132,234 | 7/1992 | Kim et al. | 437/31 |
| 5,192,992 | 3/1993 | Kim et al. | 437/31 |
| 5,196,356 | 3/1993 | Won et al. | 437/31 |
| 5,198,372 | 3/1993 | Verret | 437/31 |
| 5,204,277 | 4/1993 | Somero et al. | 437/31 |
| 5,213,989 | 5/1993 | Fitch et al. | 437/31 |

FOREIGN PATENT DOCUMENTS

| | | | |
|---|---|---|---|
| 0033495 | 1/1981 | European Pat. Off. | |

*Primary Examiner*—Olik Chaudhuri
*Assistant Examiner*—Long Pham
*Attorney, Agent, or Firm*—Blakely, Sokoloff, Taylor & Zafman

[57] ABSTRACT

A new method of isolating a polysilicon emitter from the base region of a bipolar transistor, trenching the polysilicon emitter into the semiconductor substrate, and maintaining a consistent base width of a bipolar transistor independent of variations in emitter mask thicknesses is disclosed. The polysilicon emitter isolation provides for better electrical breakdown characteristics between the emitter and the base by protecting the dielectric layer between the polysilicon emitter and base regions from defects and contamination associated with the BiCMOS manufacturing environment. The polysilicon emitter is trenched into the semiconductor substrate in order to reduce transistor operation problems associated with hot electron injection. Consistent base widths improve transistor performance uniformity thereby improving manufacturability and reliability.

15 Claims, 5 Drawing Sheets

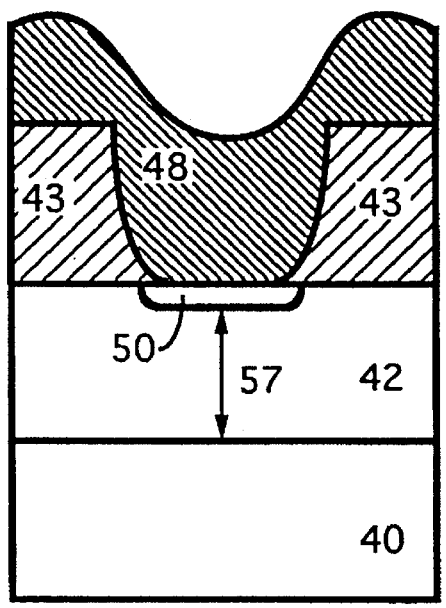
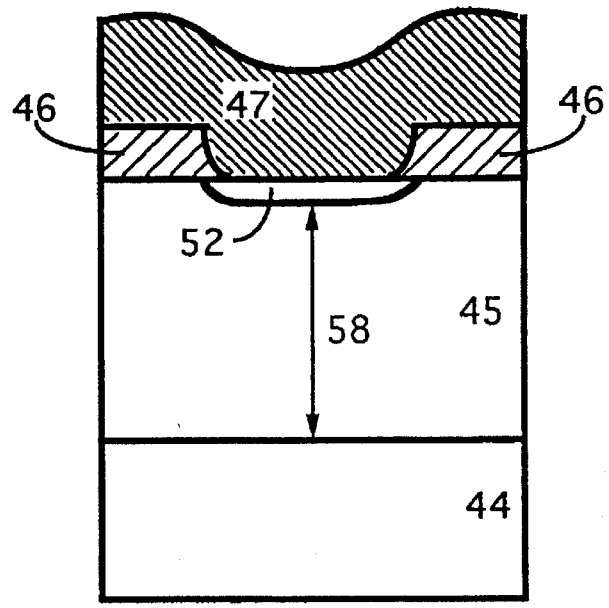
Figure 5a (Prior Art)  Figure 5b
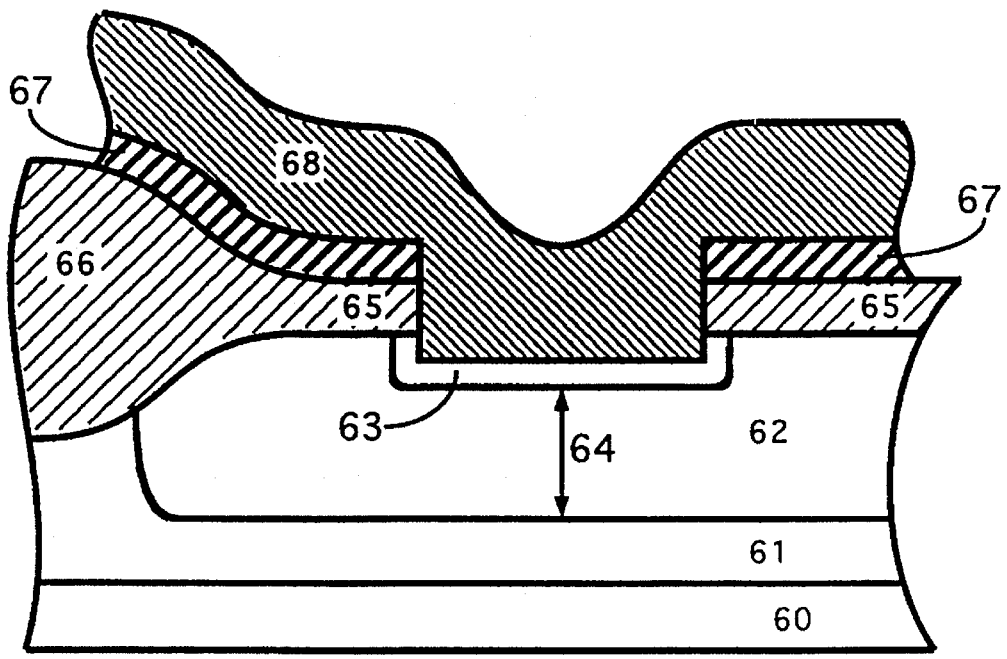
Figure 6

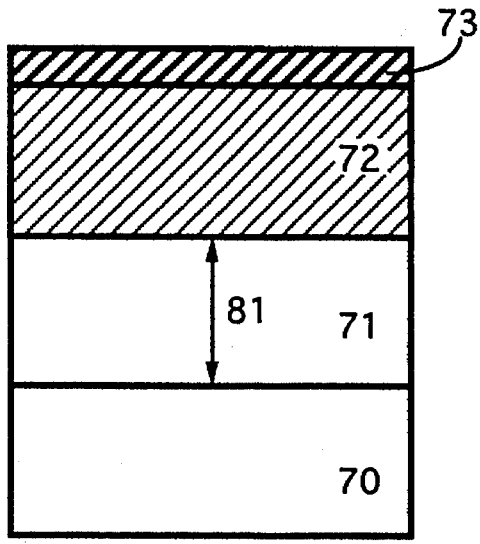
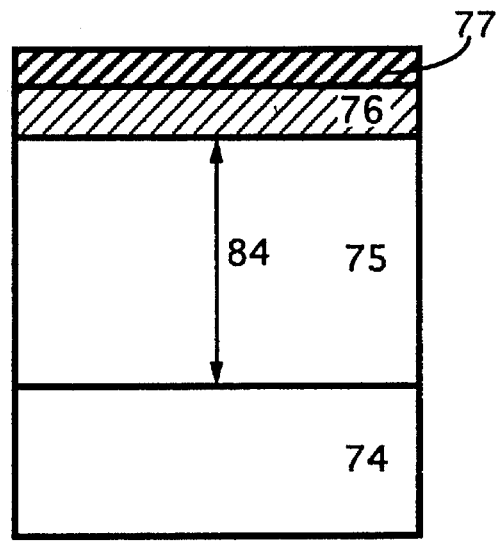
Figure 7a                    Figure 7b
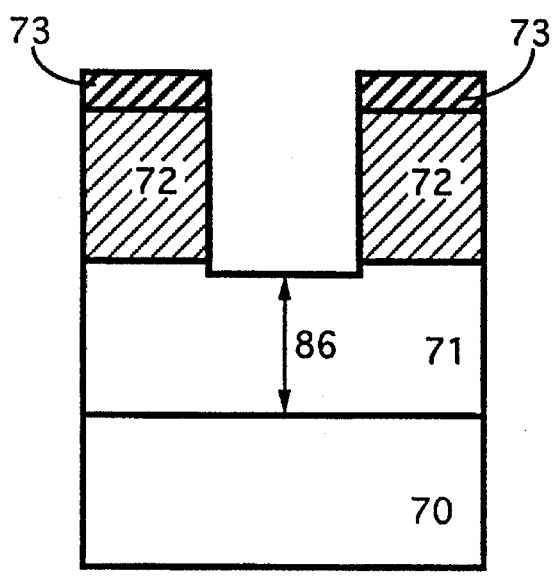
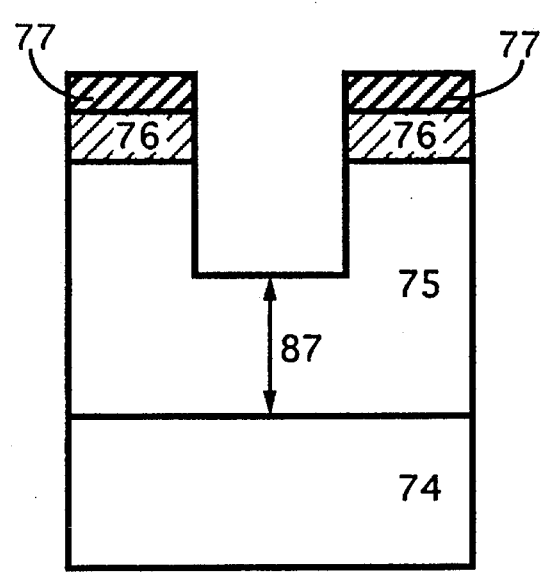
Figure 8a                    Figure 8b

METHOD OF MAKING EMITTER TRENCH BICMOS USING INTEGRATED DUAL LAYER EMITTER MASK

BACKGROUND OF THE PRESENT INVENTION

1. Field of the Invention

The present invention relates to semiconductor processing, and more particularly to a method of forming an emitter of a bipolar device.

2. Prior Art

While conventional CMOS (Complementary Metal Oxide Semiconductor) integrated circuit processes may be used to create circuits which consume less power and occupy less space on a semiconductor substrate than similar circuits designed around a bipolar transistor fabrication process, bipolar devices, among other advantages, have the inherent ability to operate at higher speeds than MOS (Metal Oxide Semiconductor) devices. In an attempt to capture the advantages of both bipolar and MOS devices in one circuit, a BiCMOS (Bipolar Complementary Metal Oxide Semiconductor) process has been developed. In a BiCMOS process, bipolar and MOS transistors are both created on a single semiconductor substrate so that a portion of the resulting circuit operates using bipolar transistors while another portion of the same circuit operates using MOS transistors. The result is a circuit which, among other advantages, consumes very little power, occupies very little space, and operates at very high speeds. A circuit such as this would have extensive applications in, for instance, battery-powered notebook computers where power consumption must be minimized in order to prolong battery life, size must be minimized to enhance portability, and processing speeds must be fast enough to handle advanced computational applications.

Process techniques for creating MOS transistors have been well developed in the art as have process techniques for creating Bipolar transistors. The combination of the two processes, however, have presented unique considerations to be weighed within the BiCMOS manufacturing environment. Generally, BiCMOS processes are built around a CMOS process base. Additional processing steps must be added to the basic CMOS process in order to incorporate bipolar transistors in the finished product. Usually 3 or 4 additional masking steps are required to convert a CMOS process into a BiCMOS process. These additional masking steps contribute to increased process throughput time and decreased product yield. The result is that the manufacturing costs associated with BiCMOS processes are much increased over conventional CMOS processes.

In order to make BiCMOS devices commercially viable, it is necessary to minimize this manufacturing cost as much as possible by, for instance, either decreasing process throughput time or decreasing product loss due to contamination thereby improving product yield. Attempts to increase process throughput time is two-faceted. First, the process steps in BiCMOS processes have been minimized by design. The basic CMOS processes upon which BiCMOS processes are built are becoming progressively more complex and time consuming, and with each new level of complexity, the CMOS process sequence is redesigned to cut as much time out of the total manufacturing budget as possible. The fact remains, however, that no matter how the manufacturing sequence of a basic CMOS process is minimized, 3 to 4 additional masking steps are expected to always be required to convert a CMOS process into a BiCMOS process. Second, the process equipment used in the manufacture of CMOS and BiCMOS products is continually being improved to minimize throughput time and feature sizes of the products. Unfortunately, the equipment costs associated with CMOS and BiCMOS processes have been increasing at an exponential rate with respect to advancing generations of these processes. Therefore, for general CMOS and BiCMOS device applications, it is most cost effective to squeeze the maximum possible yield out of each generation of the manufacturing process before moving to the next.

Improving product yield by minimizing product loss due to contamination, like increasing process throughput time, is also two-faceted. First, product yield may be improved by reducing the overall level of foreign particulates and chemicals which exist within the manufacturing environment. This foreign matter may contaminate the BiCMOS devices and cause them to become inoperable. In order to reduce the overall level of contaminants within the manufacturing environment, much expense must be invested into filtering the air, cleaning the process equipment, using only ultrapure chemicals, implementing stringently clean processing procedures, etc. Unfortunately, each successive generation of BiCMOS processes lowers the tolerable level of contamination within the manufacturing environment. Thus, significant sums of money must be spent in order to lower the mount of contamination to acceptable levels with the introduction of more advanced BiCMOS processes. Second, product yield may be improved by, wherever possible, utilizing various compounds and structures in the BiCMOS process which make the BiCMOS devices more tolerable to contamination. This way, as BiCMOS processes advance to new generations, the manufacturing environments may not need to advance to the same degree.

A bipolar transistor consists of two pn junction diodes in very close proximity. If the diodes are connected with their p-type regions facing each other, the bipolar transistor is denoted npn. If the diodes are connected with their n-type regions facing each other, the bipolar transistor is denoted pnp. Of the three regions in a bipolar transistor, the center region is called the base and is sandwiched between the outer two regions called the emitter and the collector. The current flow between the emitter and collector is controlled by the voltage applied to the base. To use a bipolar transistor for digital applications, a nominal voltage applied to the base is used to either turn "on" or "off" the emitter/collector "switch". Under steady-state biasing conditions in a bipolar transistor "off" state, the base region electrically isolates the emitter from the collector. Under steady-state biasing conditions in a bipolar transistor "on" state, the base region allows relatively unimpeded electrical current to flow between the emitter and the collector.

FIG. 1 shows a cross section of a simplified bipolar transistor. The electrical nodes 10, 11, and 12 are shown connected to emitter 16, base 17, and collector 18 regions respectively. Assuming this bipolar transistor to be npn, the emitter 16 is doped n-type, the base 17 is doped p-type, while the collector 18 is doped n-type. For electrical isolation, this bipolar transistor might be built inside a p-type well 21. The oxide masking layer 23 defines the contacts to the underlying bipolar regions. A portion of field oxide 22 is also shown in FIG. 1. In a bipolar transistor built into a semiconductor substrate, as shown in FIG. 1, the width of the base is typically defined as the minimum distance an electrical current must travel through the base in order to bridge the emitter to the collector. In FIG. 1, this minimum distance is the vertical distance through the base between the emitter 16 and the collector 18 as denoted by line 24.

Several methods have been developed to manufacture bipolar transistors. Generally, the emitter, base, and collector regions are formed by ion implantation of dopants into the semiconductor substrate. These regions are then individually contacted at the surface of the semiconductor substrate and become part of a complete circuit. In more advanced bipolar structures, the emitters are created by diffusion of a dopant from a polysilicon layer which is deposited directly onto the semiconductor substrate surface. It has been demonstrated that these polysilicon emitter, bipolar transistors exhibit current gains which are approximately five times greater than their implanted emitter counterparts. This increased current gain allows for narrower base widths to be incorporated into the transistor while still maintaining proper emitter to collector electrical isolation by increasing the doping concentration of the base region. Also, polysilicon emitter processes allow for better control of the emitter depth into the semiconductor substrate which allows for more precise narrowing of the base width. The narrower the base width becomes, the faster the transistor can switch on and off. Thus, polysilicon emitters, among other advantages, allow bipolar transistors to operate at higher speeds in digital circuits. If the base region becomes too narrow, however, the emitter to collector electrical isolation will be lost, and a phenomenon known as punchthrough will occur rendering the bipolar transistor inoperative.

Polysilicon emitters also allow the vertical and lateral dimensions of an emitter to be scaled in a coordinated manner which keeps the emitter-base junction capacitance to a reasonable value. Also, polysilicon emitters do not suffer from many of the yield problems associated with implanted emitters. For example, implanted emitters maintain lattice defects in the semiconductor substrate even after annealing due to damage from ion-bombardment during the ion implantation process. Instead, polysilicon emitter dopants are diffused into undamaged silicon so no lattice defects are created. Additionally, polysilicon emitters do not risk reliability and yield problems associated with contact spiking. Contact spiking can be a problem when implanted emitters are connected at the semiconductor substrate surface by aluminum or aluminum alloys.

FIG. 2 shows the emitter region of FIG. 1 with a polysilicon emitter replacing the implanted emitter of FIG. 1. FIG. 2 shows the polysilicon 30 which has diffused dopant into the semiconductor substrate in order to form the emitter 32 within the base 33 which in turn is within the collector 34. Assuming that the resultant bipolar transistor is of type npn, the emitter 32 is highly doped n-type, the base 33 is p-type, the collector 34 is n-type and the well 35 in which the bipolar transistor has been formed is p-type. The emitter mask 31, comprising silicon dioxide, is shown along with a portion of a field oxide region 36. Note that the polysilicon layer 30 extends beyond the lateral encroachment of the actual emitter region 32 above the base region 33 and the emitter mask 31. The emitter mask 31, therefore, protects the bipolar transistor from electrically shorting the emitter-base junction. For instance, if an electrical breakdown occurred in the emitter mask 31 anywhere under the polysilicon layer 30, the voltages applied to the base region 33 would be transferred directly to the polysilicon emitter. An electrical breakdown such as this would destroy the transistor action of the bipolar device. Any significant defects or contaminants in the emitter mask 31, particularly at the polysilicon-oxide interface, may cause such a breakdown to occur thereby potentially rendering the bipolar device inoperative. Therefore, it is necessary to keep the emitter mask 31 immaculately clean and free from all defects.

In a typical BiCMOS process, it is difficult to maintain the cleanliness of this emitter mask 31 because it is subjected to many harsh process environments. For instance, the application and stripping of the photoresist which defines the emitter window in the emitter mask, and the polysilicon preclean steps which usually precede polysilicon deposition can leave defects and contaminants in the emitter mask at the polysilicon-oxide interface. Upon operation of a bipolar transistor, these defects and contaminants serve as catalysts to the electrical breakdown of the emitter mask 31 between the polysilicon emitter 30 and the base region 33. As stated above, the occurrence of such a breakdown may render the bipolar device inoperative thus lowering product yield.

In FIG. 2, the base width is denoted as distance 37. As mentioned earlier, if the base width 37 is too large, bipolar transistor switching speed will be degraded. If the base width 37 becomes too small, emitter 32 to collector 34 punchthrough will occur. It is therefore necessary to accurately maintain the base width to exacting tolerances. Unfortunately, since the base region 33 is implanted through the emitter mask 31 prior to patterning of the emitter window in the emitter mask 31, variations in emitter mask 31 thickness will be shadowed by variations in base implant depth into the semiconductor substrate. There are generally three components which contribute to emitter mask thickness variation. First, there is variation across the surface of a single semiconductor substrate (generally referred to as die level variation). Second, there is variation across multiple semiconductor substrates processed together at the same process step (generally referred to as wafer level variation). Third, there is variation across multiple semiconductor substrates processed separately at the same process step (generally referred to as lot level or batch level variation).

FIGS. 3a and 3b show slices from two different semiconductor substrates at the same processing step during a BiCMOS process. The slices were taken through what will become the emitter region of a bipolar transistor. The semiconductor slice depicted in FIG. 3a comprises a collector region 40, an emitter mask 43, and a base region 42 which has been implanted through the emitter mask 43. The semiconductor slice depicted in FIG. 3b comprises a collector region 44, an emitter mask 46, and a base region 45 which has been implanted through the emitter mask 46. Note the difference between the two slices in FIGS. 3a and 3b in base region depth into the semiconductor substrate. In FIG. 3a, the base region depth 55 is much shallower than the base region depth 56 of FIG. 3b. This difference is due to the difference in emitter mask thicknesses. The thicker the oxide emitter mask, the less distance an implanted ion will travel beneath the oxide-silicon interface since the ion's velocity is significantly slowed by the emitter mask layer.

FIGS. 4a and 4b show the same semiconductor substrate slices of FIGS. 3a and 3b respectively after the emitter windows have been etched into the emitter mask. Note that the emitter windows are etched such that the bottom of the windows exist at the surface of the base regions of the semiconductor substrate. Because the semiconductor substrate behaves as an etch stop to the emitter window etch, the base region depth 55 in FIG. 4a and the base region depth 56 in FIG. 4b remain unchanged from the base region depths in FIGS. 3a and 3b respectively. Hence, the difference in base region depths between the two semiconductor slices is propagated on to the next step in the BiCMOS fabrication process.

FIGS. 5a and 5b show the same semiconductor substrate slices of FIGS. 4a and 4b after the polysilicon has been deposited and emitters have been created. The semiconductor slice in FIG. 5a now comprises a polysilicon layer 48 and a diffused emitter region 50. The semiconductor slice in FIG. 5b also comprises a polysilicon layer 47 and an emitter diffused region 52. The actual base width 57 of FIG. 5a is now apparent as is the base width 58 of FIG. 5b. Note the difference in the base widths between the two slices. This difference is a direct result of the difference in the emitter mask thicknesses of FIGS. 3a and 3b which caused the different base implant depths beneath the semiconductor substrate surface. This difference in base widths can result in either inoperative, or unreliable bipolar transistors which will lower product yield. In the case of FIG. 5a, the base width 57 may be too narrow to provide proper emitter 50 to collector 40 isolation which will result in punchthrough. In the case of FIG. 5b, the base width 58 may be too large to allow for the necessary switching speeds. Finally, because a BiCMOS process which allows such a large variation in base widths will produce unpredictable circuits, it becomes difficult, if not impossible, to design complex systems around these processes.

In typical BiCMOS bipolar transistors, the base doping profile is graded such that the maximum doping concentration exists near the surface of the base, near the boundary between the emitter mask 31 and the base region 33 in FIG. 2. Under electrical bias, the high doping concentration of the base in conjunction with the high doping concentration of the emitter causes a very strong electric field to exist at the emitter-base pn junction. These strong electric fields lead to hot electron generation. If the hot electrons are generated in the vicinity of an oxide, a certain percentage of electrons will be injected into that oxide and become trapped. These trapped electrons then have the potential to adversely affect the electrical characteristics of the bipolar device.

Note that the lateral edges of the diffused emitter region 32 in FIG. 2 are in mutual contact with both the surface of the base region 33 and the emitter mask 31. Therefore, the hot electrons generated at the lateral edges of the diffused emitter region have the potential to be injected into the emitter mask 31 and become trapped there. These trapped electrons can then degrade the performance of the bipolar transistor thereby causing yield and reliability problems. Note that silicon substrate cleaning processes may remove a portion of the silicon substrate in the emitter window prior to depositing the polysilicon. These cleaning processes, while perhaps causing a very shallow emitter trench in the silicon substrate, are generally not sufficient to move the strong electric field far enough away from the emitter mask to avoid the deleterious effects of hot electron injection into the emitter mask.

SUMMARY OF THE PRESENT INVENTION

After a silicon dioxide layer of the emitter mask which will define the emitter window in a bipolar device has been formed, a second layer such as silicon nitride, polysilicon, or amorphous silicon is deposited on top of the oxide layer to form the dual layer emitter mask. This second layer protects the underlying oxide layer from contaminants during subsequent processing and acts as a buffer layer between the polysilicon emitter layer which is deposited later and the oxide layer of the dual layer emitter mask. The result is a much more robust emitter mask dielectric separating the polysilicon emitter from the base region of the bipolar device, thus improving yields. The dual layer emitter mask is then etched to open the emitter window. The oxide layer of the dual layer emitter mask is etched anisotropically using an etch chemistry with a selectivity of approximately 1:1 of silicon dioxide to silicon. This is to be a timed etched such that variation in the base-collector junction depth due to variation in the oxide layer thickness is tracked by the emitter-base junction depth. The result is that the base widths of all bipolar transistors manufactured using this process will be approximately the same regardless of the variations in thickness of the oxide layer of the dual layer emitter mask. Polysilicon is then deposited over the dual layer emitter mask and into the emitter window in order to form the polysilicon emitter, and the BiCMOS process is completed as usual.

BRIEF DESCRIPTION OF THE DRAWINGS

FIGS. 5a and 5b show the cross-sections of FIGS. 4a and 4b respectively after the polysilicon emitters have been created.

FIG. 6 is a cross-sectional view of the polysilicon emitter of a bipolar device containing a dual-layer dielectric emitter mask.

FIGS. 7a and 7b show cross-sectional views of the polysilicon emitters of two bipolar devices, including a dual-layer dielectric emitter mask, before the emitter windows have been etched.

FIGS. 8a and 8b show the cross-sections of FIGS. 7a and 7b respectively after the emitter windows have been etched.

DETAILED DESCRIPTION OF THE PRESENT INVENTION

Figure 1:
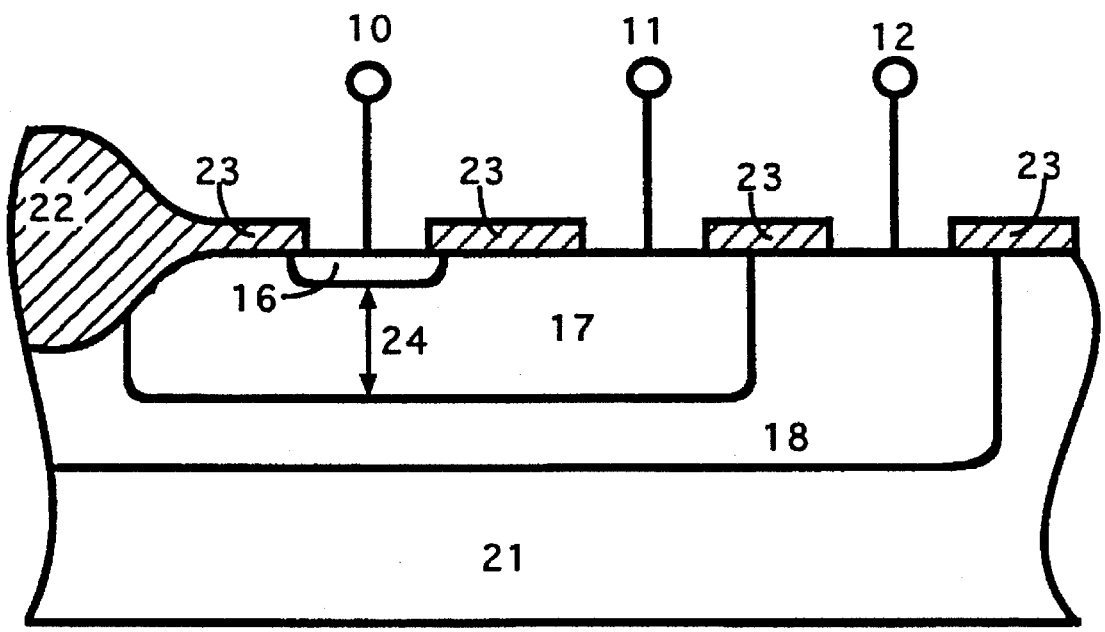
FIG. 1 is a cross-sectional view of a bipolar device.
Figure 2:
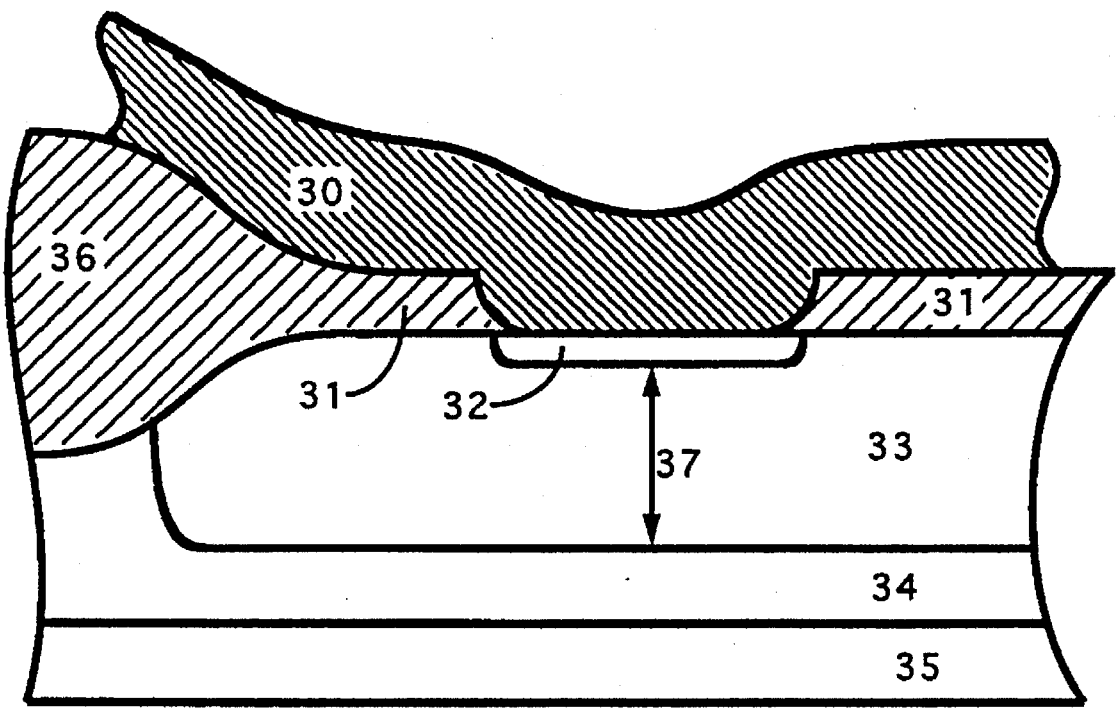
FIG. 2 is a cross-sectional view of the polysilicon emitter of a bipolar device.
Figure 3A:
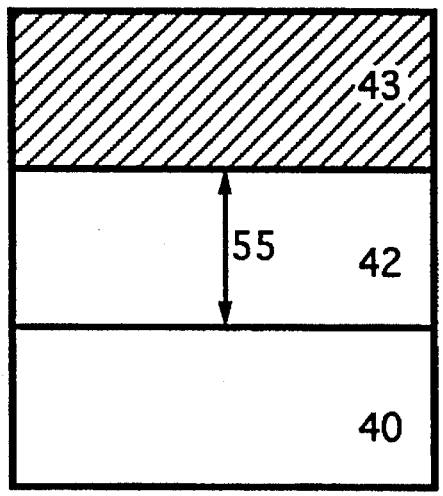
FIGS. 3a and 3b show cross-sectional views of the polysilicon emitters of two bipolar devices before the emitter windows have been etched.
Figure 3B:
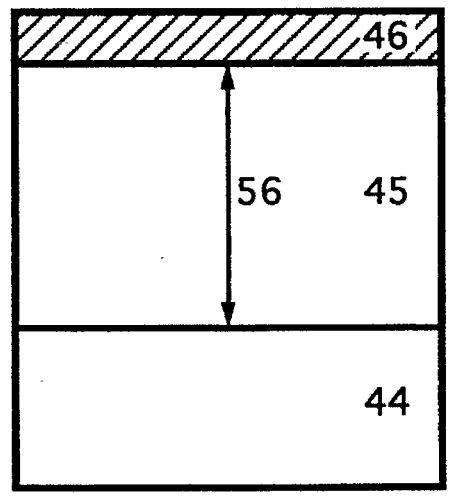
Figure 4A:
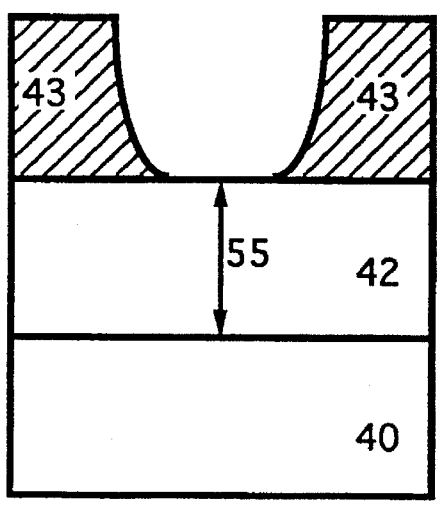
FIGS. 4a and 4b show the cross-sections of FIGS. 3a and 3b respectively after the emitter windows have been etched.
Figure 4B:
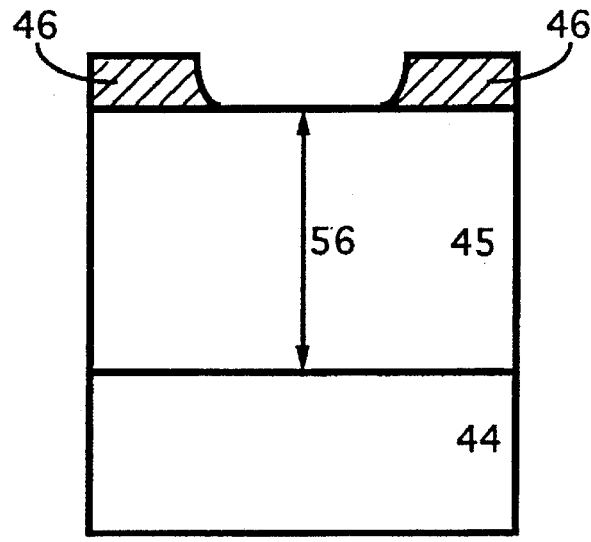

A bipolar transistor manufacturing process is described which not only improves the dielectric breakdown characteristics of the emitter mask between the polysilicon emitter and the base region of the bipolar device but also maintains consistent base widths independent of emitter mask dielectric thickness variation. In the following description, numerous specific details such as layer thicknesses, process sequences, etc., are set forth in order to provide a more thorough understanding of the present invention. It will be obvious, however, to one skilled in the art, that the present invention may be practiced without employing these specific details. In other instances, well-known processes have not been described in detail in order not to unnecessarily obscure the present invention.

While cross sections representing a currently preferred embodiment of the present invention are illustrated in FIGS. 6–9, these illustration are not intended to limit the invention. The specific processes described herein are only meant to help clarify one's understanding of the disclosed process and to illustrate currently preferred embodiments of how the disclosed process may be implemented in order to form a currently preferred device.

FIG. 6 shows a cross section of the emitter region of a bipolar device created using a currently preferred embodiment of the present invention. FIG. 6 shows the polysilicon

68 which has diffused dopant into the semiconductor substrate in the emitter contact region in order to form the emitter 63 within the base 62 which in turn is within the collector 61. In a currently preferred embodiment of the present invention, the bipolar transistor is of type npn and is constructed in a silicon substrate, however other embodiments may include pnp transistors and may be built in other semiconductor materials. Still other embodiments of the present invention may not include a transistor at all but rather any generic contact to substrate, and the polysilicon layer 68 may be replaced with any other conductive film layer. The emitter 63 is highly doped n-type, the base 62 is p-type, the collector 61 is n-type and the substrate 60 in which the bipolar transistor has been formed is p-type. In a currently preferred embodiment of the present invention, the emitter mask comprises a dual layer dielectric of silicon nitride 67 and silicon dioxide 65. Alternate embodiments of the present invention may substitute other layers, such as, for example, amorphous silicon or polysilicon, to replace either or both of the layers 67 and 65 in the dual layer emitter mask. A portion of a field oxide region 66 is also shown as is the base width 64 of the bipolar transistor.

FIGS. 7a and 7b show slices from two different semiconductor substrates at the same processing step during a BiCMOS process consistent with a currently preferred embodiment of the present invention. The slices were taken through what will become the emitter regions of two bipolar transistors. In a currently preferred embodiment of the present invention, a layer of oxide is grown or deposited onto the semiconductor substrate in order to form a first layer of the emitter mask of a bipolar transistor, and in particular, a bipolar transistor which will include a polysilicon emitter. The oxide layer of the emitter mask is shown in FIG. 7a as layer 72 and in 7b as layer 76. The thickness of this oxide layer is approximately 200Å, however, alternate embodiments of the present invention may include oxide thicknesses in the range of approximately 50Å to 500Å. Still other embodiments of the present invention may not include a first oxide layer at all but rather some other dielectric material. In a currently preferred embodiment, a nitride layer is then deposited onto the oxide layer. The nitride layer of the emitter mask is shown in FIG. 7a as layer 73 and in FIG. 7b as layer 77. The thickness of this nitride layer is approximately 60Å, however, alternate embodiments of the present invention may include nitride thicknesses in the range of approximately 40Å to 400Å. Also, alternate embodiments of the present invention may not include a nitride layer at all but rather but rather some other material, such as, for instance, amorphous silicon or polysilicon. Finally, in a currently preferred embodiment of the present invention, the nitride layer is deposited immediately after the oxide layer is deposited. However, alternate embodiments may deposit the nitride layer or any other layer of the emitter mask at any step in the process flow prior to etching the emitter window through the emitter mask. For example, 1 or more layers of the emitter mask may be deposited before the base implant process step while 1 or more layers of the emitter mask may be deposited after the base implant process step.

In a currently preferred embodiment of the present invention, after the nitride has been deposited, the Bipolar, BiCMOS, or any other bipolar transistor manufacturing process continues, defining the necessary structures in the MOS or bipolar regions of the circuit. During the processing subsequent to depositing the nitride layer of the emitter mask and prior to depositing the polysilicon emitter layer, the nitride layer of the emitter mask protects the underlying oxide layer from contaminants and defects which are introduced at the surface of the nitride layer. Because the nitride layer is less sensitive to these contaminants and defects than would be the oxide layer, these contaminants and defects are less likely to induce an electrical breakdown of the emitter mask from the nitride-polysilicon interface. Therefore, the dual layer emitter mask is better able to withstand more harsh manufacturing environments than an oxide emitter mask alone. The result is an improvement in yields of bipolar transistors incorporating this dual layer emitter mask. In alternate embodiments of the present invention, 2 or more layers of any material are deposited in order to form the emitter mask. At least one layer of the emitter mask may be constructed of a material which displays an improved tolerance to contaminants or defects than the other layer or layers. It should be noted that the incorporation of a dual layer emitter mask in a semiconductor device is not necessary in order to practice the method of creating a trenched emitter in a bipolar transistor as described below. Therefore, in alternate embodiments of the present invention, only a single dielectric layer is used, such as oxide for instance, to create the emitter mask.

Since variability in thickness is associated with every layer created in any semiconductor process, it is important to recognize that each layer of the emitter mask contributes to the variability in thickness of the total emitter mask. The semiconductor slice in FIG. 7a comprises a collector region 70, the oxide layer of the emitter mask 72, the nitride layer of the emitter mask 73, and a base region 71 which has been implanted through the emitter mask. The semiconductor slice in FIG. 7b comprises a collector region 74, the oxide layer of the emitter mask 76, the nitride layer of the emitter mask 77, and a base region 75 which has been implanted through the oxide layer of the emitter mask 76. Note the difference between the two slices in FIGS. 7a and 7b in base region depth into the silicon substrate. In FIG. 7a, the base region diffusion depth 81 is much shallower than the base region diffusion depth 84 of FIG. 7b. This difference is due to the difference in emitter mask thicknesses, and in particular, to the difference in oxide layer thicknesses of the emitter mask. The thicker the oxide layer in the emitter mask, the less distance an implanted ion will travel beneath the oxide-silicon interface since the ion's velocity is significantly slowed by the oxide layer in the emitter mask. Note that the diffusion depths (81 and 84) of the base regions at this step in the process will diffuse even further into the silicon substrate with subsequent applications of heat, however the difference between the two diffusion depths will remain.

FIGS. 8a and 8b show the same semiconductor substrate slices of FIGS. 7a and 7b respectively after the emitter windows have been etched into the emitter mask utilizing a process consistent with a currently preferred embodiment of the present invention. The emitter windows in the emitter mask are etched anisotropically using standard lithographic techniques to define the dimensions of the window. The nitride layer is first etched using standard nitride etching procedures. In a preferred embodiment of the present invention, the oxide layer is then etched for a certain period of time using an etchant chemistry which yields approximately 1:1 selectivity of $SiO_2$ to Si, which is to say that the etchant chosen should etch oxide at approximately the same rate as it etches silicon. The etch of the emitter window then proceeds slightly beyond the oxide-silicon interface such that the bottom of this emitter window maintains a consistent distance from the base-collector junction defined by the boundary between the base region (71 and 75) and the collector region (70 and 74). Note that the distance between the base-collector junction and the bottom of the emitter window in FIG. 8a, labeled 86, is the same as the distance in FIG. 8b, labeled 87, even though the thicknesses of the oxide layer in the emitter masks were different between the two semiconductor substrate slices. This is because the etch chemistry used to etch the emitter windows and the silicon substrates has "tracked" the ions which have been implanted through the emitter masks into the silicon substrates in order to form the base regions. Plasma etch chemistries utilizing $C_2F_6$, $CF_4$, $CHF_3$, $CCl_2F_2$, other fluorocarbon gases, $SF_6$, $NF_3$, other fluorochemicals, or any combination of these chemistries may be used in various embodiments of the present invention in order to achieve the necessary 1:1 selectivity of $SiO_2$ to Si.

Different ionic species have different projected ranges through different materials at any given implant energy. For instance, in a currently preferred embodiment of the present invention, boron is used to dope the base p-type. Boron has a projected range of approximately 0.24 µm through both $SiO_2$ and Si at an implant energy of about 80keV. Since boron will travel through $SiO_2$ and Si at approximately the same rate, an etch chemistry of approximately 0.24:0.24 or 1:1 selectivity of $SiO_2$ to Si will suffice in order to "track" a boron ion's trajectory through the oxide layer of an emitter mask and into a silicon substrate. However, an alternate embodiment of the present invention may be practiced in which a pnp transistor is being created, and arsenic is used to dope the base n-type. Arsenic has a projected range of approximately 0.04µm through $SiO_2$ and 0.05µm through Si at an implant energy of about 80keV. In such a case, an etch chemistry of approximately 0.04:0.05 or 4:5 selectivity of $SiO_2$ to Si will be required to "track" an arsenic ion's trajectory through the oxide layer of an emitter mask and into a silicon substrate. Generally, the projected range of a particular ionic species through a particular material remains constant relative to the projected range of that same species through another particular material over a relatively wide range of implant energies so that in cases where multiple energies are used to implant a particular ionic species, a single etch chemistry yielding a particular etch selectivity may be chosen.

The basic rule to follow is that given a stack of materials through which a species has been implanted, the stack of materials should be etched using an etch chemistry whose ratio of selectivity of one material to another is the same as the ratio of the projected range of the species through one material versus another. For instance, given a species implanted into silicon with a projected range of 2µm through a composite film of materials made up of layer A with a projected range of 4µm, layer B with a projected range of 8µm, and layer C with a projected range of 3µm, a trench should be etched through the composite film and into the silicon using an etch chemistry which yields a 4:8:3:2 selectivity of material A to material B to material C to silicon in order to maintain a consistent distance between the bottom of the trench and the depth of the implanted species regardless of variations in any or all of the layers in the composite film.

Generally, however, using an etch chemistry of 1:1 is a good enough approximation for many alternate embodiments of the present invention in which nearly any dopant species including boron and arsenic is used in conjunction with nearly any material including $SiO_2$ and Si. Exact tracking may not be necessary and depends on the level of performance needed. In alternate embodiments of the present invention, the upper layers of a composite film may not significantly contribute to the variation in thickness of the total composite film or may have been formed after the ion implantation step and therefore may be etched by a separate etch chemistry which need not conform to the etch selectivity ratio role set forth above.

In a currently preferred embodiment of the present invention, the etch of the oxide layer in the emitter window in the emitter mask is performed for a length of time such that a portion of the underlying silicon substrate is also etched. Therefore, the time chosen should be the time necessary to slightly etch into the silicon substrate after etching through the thickest emitter mask oxide layer which could conceivably be created by a given process. For instance, the oxide layer 72 in the semiconductor slice in FIG. 7a is obviously thicker than the oxide layer 76 in the semiconductor slice in FIGS. 7b. When both these semiconductor slices were etched using a currently preferred embodiment of the present invention, they were etched to the same depth as measured from the surface of the nitride layer (73 and 77) to the exposed silicon at the bottom of the emitter window as can be seen in FIGS. 8a and 8b. In a currently preferred embodiment of the present invention, the silicon substrate is etched to an avenge depth of approximately 250Å beneath the oxide-silicon interface. Of course, this depth will vary from one trench to the next depending on the local thickness of the oxide layer (72 and 76) in accordance with the principles of the present invention. In alternate embodiments of the present invention, the semiconductor substrate may be etched to an approximate depth in the range of 50Å–1000Å. In still other embodiments of the present invention, the semiconductor substrate may be etched even deeper, however it should be noted that with increased depth into the semiconductor substrate comes a loss of accuracy and precision in controlling that depth.

After etching the emitter window into the emitter mask, standard processing continues which may include stripping of the resist which defined the emitter window, cleaning of the substrate surface, etc. Eventually, the polysilicon which is to form the polysilicon emitter is deposited and patterned. In a preferred embodiment of the present invention, the nitride layer of the emitter mask (67 in FIG. 6) is etched along with the patterning of the polysilicon layer using standard nitride etching processes. In alternate embodiments of the present invention, the nitride layer of the emitter mask may remain on the wafer, or may be removed during any process step subsequent to patterning of the polysilicon emitter.

Figure 9A:
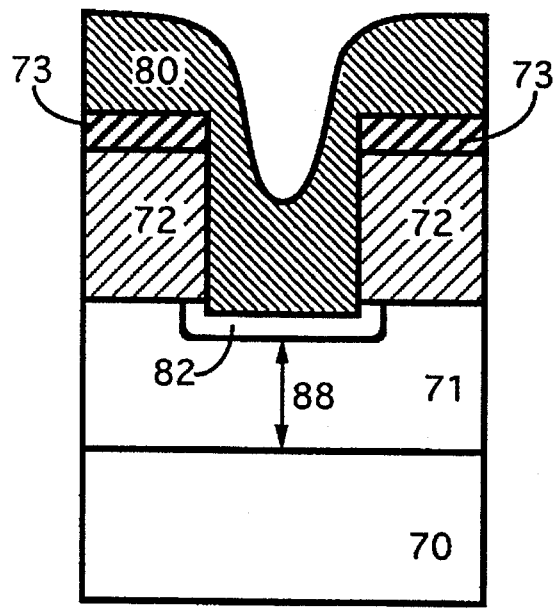
FIGS. 9a and 9b show the cross-sections of FIGS. 8a and 8b respectively after the polysilicon emitters have been created.
Figure 9B:
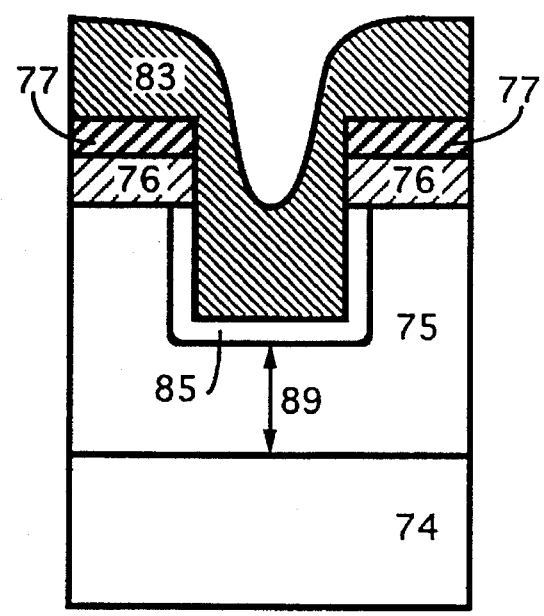

In FIG. 9a, the semiconductor substrate slice of FIG. 8a is shown which now comprises a polysilicon layer 80 and an emitter diffused region 82. FIG. 9b shows the semiconductor substrate slice of FIG. 8b which now also comprises a polysilicon layer 83 and an emitter diffused region 85. The base widths of both semiconductor slices are denoted 88 and 89. Note that the base width 88 of the semiconductor slice in FIG. 9a is approximately the same as the base width 89 of the semiconductor slice in FIG. 9b. This is because the difference in oxide thicknesses between the two semiconductor slices which caused the difference in implant depths beneath the silicon surface has caused the same difference in emitter window etch depths beneath the silicon surface. The result is that the emitter-base junction maintains approximately the same relative distance from the base-collector junction thus maintaining a consistent base width regardless of the differences in emitter mask oxide thicknesses.

In a preferred embodiment of the present invention, the dopants which form the base region are implanted such that the maximum doping concentration will exist at or near the emitter-base junction closest to the base-collector junction.

Since the emitter will be somewhat trenched into the silicon substrate as shown in FIGS. 6, 9a, and 9b, the maximum base doping concentration, and hence the maximum electric field strength, will be located a safe distance from the emitter mask oxide layer (labeled 65, 72 and 76 respectively). Thus, hot electron injection into the emitter mask oxide layer will be reduced. For this reason, the emitter should be trenched into the silicon substrate at least 10Å. Currently preferred embodiments of the present invention trench the emitter region deeper into the semiconductor substrate in order to further reduce the deleterious effects of hot electron injection since the deeper the trench, the fewer hot electrons that will reach the emitter mask. Also, since the base region will then need to be implanted further into the silicon substrate, less dopant will be implanted into the emitter mask. Dopant material residing in the emitter mask oxide layer tends to degrade the quality of the oxide by, for instance, creating sites at which hot electrons may be easily trapped. Since less dopant will be implanted into the emitter mask, the oxide quality will be improved.

A bipolar transistor manufacturing process and device has been described which not only improves the dielectric breakdown characteristics of the emitter mask between the polysilicon emitter and the base region of the bipolar device but also maintains consistent base widths independent of emitter mask thickness variation. Furthermore, hot electron degradation is minimized by the present invention.

We claim:

1. A method of maintaining an approximately constant, relative distance between a bottom of a trench etched through a first layer and into a semiconductor substrate and a diffusion depth of a doped region of said semiconductor substrate which has been implanted through said first layer, said distance between said trench bottom and said diffusion depth being constant regardless of variations in thickness of said first layer, said method comprising the steps of:

(a) forming said first layer above said semiconductor substrate;

(b) implanting a dopant material through said first layer and into said semiconductor substrate to create said doped region within said semiconductor substrate; and (c) forming said trench by etching through said first layer and said semiconductor substrate using an etchant which etches said first layer and said semiconductor substrate with an etch selectivity having an etch ratio of said first layer to said semiconductor substrate approximately equal to a ratio of projected implanted ranges of said dopant material of said first layer to said semiconductor substrate.

2. The method as defined by claim 1 wherein said fast layer includes $SiO_2$ and said semiconductor substrate includes Si.

3. The method as defined by claim 1 wherein said method further comprises a step of depositing a conductive layer into said trench.

4. The method as defined by claim 1 wherein said etch ratio of said first layer to said semiconductor substrate is approximately 1:1.

5. The method as defined by claim 1 wherein said etching is performed by an anisotropic plasma etch with said etchant comprising a chemical selected from a group consisting of $C_2F_6$, $CF_4$, $CHF_3$, $CCl_2F_2$, $SF_6$, $NF_3$, and any combination thereof.

6. A method of maintaining an approximately constant base width in a bipolar transistor which has been built into a silicon substrate, said base width being constant regardless of variations in thickness of an oxide layer residing above said silicon substrate, said method comprising the steps of:

(a) forming said oxide layer above said silicon substrate;

(b) implanting a dopant material through said oxide layer and into said silicon substrate to create a base region of said bipolar device within said silicon substrate; and (c) etching through a first portion of said oxide layer and a portion of said silicon substrate using a timed etch having an etchant which etches said oxide layer and said silicon substrate with an etch selectivity having an etch ratio said oxide layer to said silicon substrate approximately equal to a ratio of projected ranges of said dopant material of said oxide layer to said silicon substrate.

7. The method as defined by claim 6 wherein said method constitutes part of a BiCMOS process 8. The method as defined by claim 6 wherein said method further comprises a step of forming a conductive layer into said portion of said silicon substrate in order to form a contact to an emitter or collector of said bipolar transistor.

9. The method as defined by claim 8 wherein said conductive layer comprises polysilicon.

10. The method as defined by claim 6 wherein said etching through said first portion of said oxide layer and through said portion of said silicon substrate is done by an anisotropic plasma etch having said etch ratio of said oxide layer to said silicon substrate of approximately 1:1.

11. The method as defined by claim 6 wherein said etchant comprises a chemical selected from a group consisting of $C_2F_6$, $CF_4$, $CHF_3$, $CCl_2F_2$, $SF_6$, $NF_3$, and any combination thereof.

12. The method of claim 6 wherein said etching through said first portion of said oxide layer and through said portion of said silicon substrate is performed for a selected period of time such that a bottom portion of an emitter-base junction of said bipolar transistor is formed at an approximate location where a doping concentration of a base region of said bipolar transistor is at a maximum.

13. The method of claim 9 wherein said etching is performed for a period of time selected such that a bottom portion of an emitter-base junction of said bipolar transistor is formed at an approximate location where a doping concentration of a base region of said bipolar transistor is at a maximum.

14. The method of claim 9 wherein a protective layer is formed over said oxide layer such that said protective layer separates said polysilicon from said oxide layer over a base region of said bipolar transistor.

15. The method of claim 14 wherein said protective layer comprises a material selected from the group consisting of silicon nitride, amorphous silicon, polysilicon, and any combination thereof.

* * * * *

UNITED STATES PATENT AND TRADEMARK OFFICE
CERTIFICATE OF CORRECTION

PATENT NO. : 5,488,003
DATED : January 30, 1996
INVENTOR(S) : Chambers et al.

It is certified that error appears in the above-indentified patent and that said Letters Patent is hereby corrected as shown below:

In column 11 at line 51 delete "fast" and insert --first--

In column 12 at line 17 delete "ratio said" and insert --ratio of said--

Signed and Sealed this

Third Day of September, 1996

Attest:

BRUCE LEHMAN

Attesting Officer                Commissioner of Patents and Trademarks